US011967748B2

(12) United States Patent
Accatino

(10) Patent No.: US 11,967,748 B2
(45) Date of Patent: Apr. 23, 2024

(54) SINGLE MODE CAVITY FILTER

(71) Applicant: AC CONSULTING DI LUCIANO ACCATINO, Rivoli (IT)

(72) Inventor: Luciano Accatino, Rosta (IT)

(73) Assignee: NAXOS FINANCE S.A., Luxembourg (LU)

( * ) Notice: Subject to any disclaimer, the term of this patent is extended or adjusted under 35 U.S.C. 154(b) by 448 days.

(21) Appl. No.: 17/386,980

(22) Filed: Jul. 28, 2021

(65) Prior Publication Data
US 2022/0045662 A1 Feb. 10, 2022

(30) Foreign Application Priority Data

Aug. 7, 2020 (IT) .................. 102020000019594

(51) Int. Cl.
*H01P 1/208* (2006.01)
*H01P 1/207* (2006.01)
*H03H 9/46* (2006.01)

(52) U.S. Cl.
CPC .............. *H01P 1/208* (2013.01); *H01P 1/207* (2013.01); *H03H 9/462* (2013.01)

(58) Field of Classification Search
CPC ........ H01P 1/208; H01P 1/207; H01P 1/2053; H01P 1/205; H01P 1/202

USPC .................................................. 333/202–207
See application file for complete search history.

(56) References Cited

FOREIGN PATENT DOCUMENTS

| JP | S6199401 A | 5/1986 |
| KR | 20190015958 A | 2/2019 |
| WO | 2010033057 A1 | 3/2010 |

OTHER PUBLICATIONS

Search Report for Corresponding Italian Application No. IT 202000019594 (dated Mar. 31, 2021) (7 Pages).

*Primary Examiner* — Rakesh B Patel
(74) *Attorney, Agent, or Firm* — LUCAS & MERCANTI, LLP

(57) ABSTRACT

A single mode cavity filter having at least three rectangular or elliptical resonant cavities and at least four coupling irises aligned along a straight axis is disclosed. The filter is configured to be tuned by way of an electro-mechanical device. The filter has tuning rods located in each of the cavities and configured to change, in use, the tuning of the filter. The tuning rods are aligned along an arcuate axis and the electro-mechanical device is configured to move the tuning rods according to an identical depth by way of a single motor in the electro-mechanical device.

12 Claims, 6 Drawing Sheets

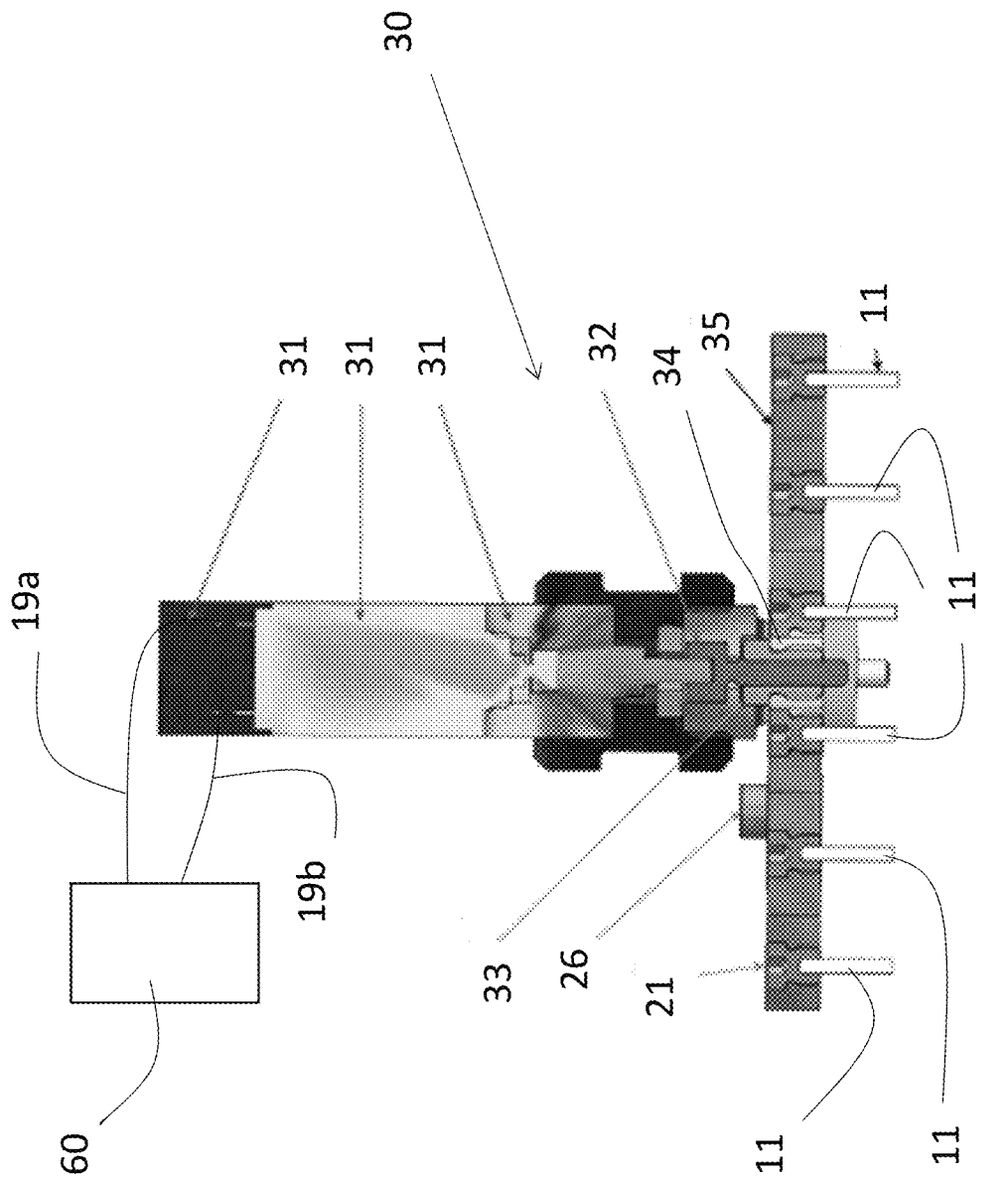

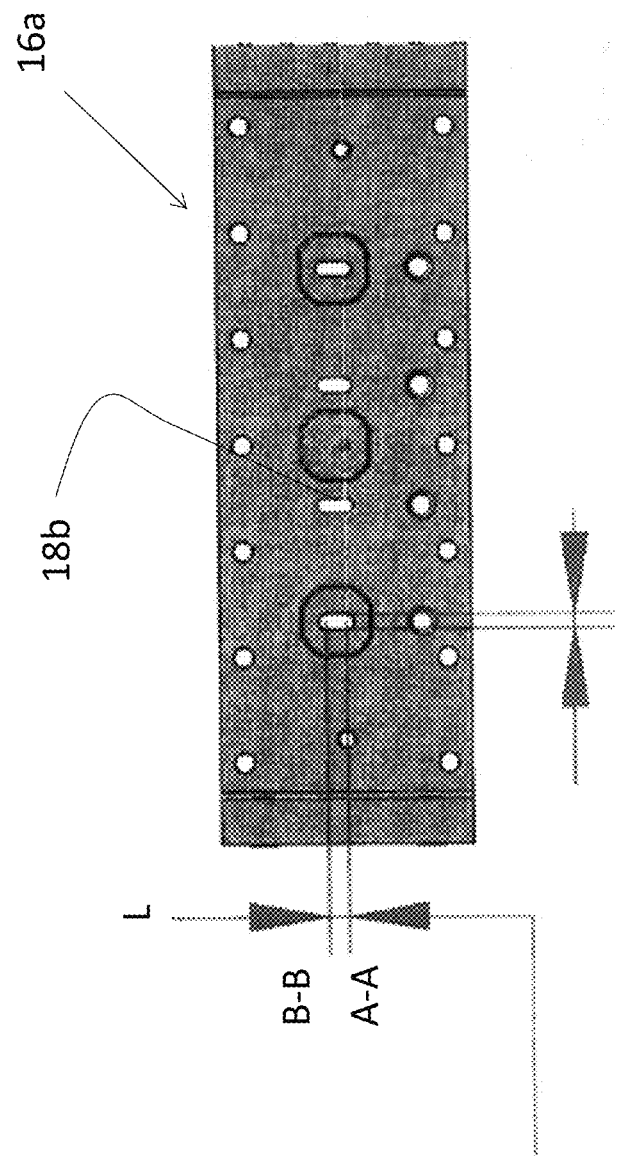

SINGLE MODE CAVITY FILTER

CROSS-REFERENCE TO RELATED APPLICATIONS

This application claims the benefit of priority from Italian Patent Application Serial No. 102020000019594, filed Aug. 7, 2020, the contents of which are incorporated herein by reference.

TECHNICAL FIELD

The present invention relates, in general, to a single mode cavity filter to be used in terrestrial and satellite applications.

In particular present invention relates to single-mode rectangular cavities configured so as to provide one single resonant mode. More in particular present invention relates to a single-mode filter comprising three or more (n) resonant cavities and four or more (n+1) coupling irises.

BACKGROUND OF THE INVENTION

It is known that single-mode cavity filters are typically used in radio link applications. In particular, it is known, that telecommunication companies, in case of special events, as for instance football or fair events, need to use one or more channels, for example satellite channels, for broadcasting online information, pertaining the special events, by way of Television or Radio channels.

According to known prior art, the telecommunication companies provide to request, for instance, one channel among a plurality of channels, and, following the fact to be enabled for using a certain channel, make use of an apparatus comprising a filter bench including a plurality of single-mode filters and provide to select, by way of an electro-mechanical device, one filter, among the plurality of single-mode filters, arranged to manage the enabled channel.

The electro-mechanical selection of a certain single-mode filter is such to grant access to the channel for broadcasting online information pertaining the special events.

A problem of known prior art is that the selection of a channel among a plurality of channels requires to make use of an apparatus comprising a filter bench wherein each filter is only selectable by using an input and output electro-mechanical device.

Applicant, in general, has noted that known prior-art does not solve the problem of selecting in a simple and effective way one channel among a plurality of channels in case of single mode cavity filters for satellite and/or terrestrial applications.

SUMMARY OF THE INVENTION

An object of the present invention is thus to solve the problem outlined above by providing a single mode cavity filter very simple and effective wherein a certain channel, i.e. a center frequency, among a plurality of channels or center frequencies, is dynamically selectable as a function of the enabled channel.

According to the present invention, such an object is achieved by way of a single mode cavity filter comprising the features set forth in the claims that follow.

The present invention also relates to a process or method for designing and realizing the filter according to the invention.

Claims are an integral part of the teaching of the present invention.

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

According to the invention, the single mode cavity filter comprises at least three rectangular or elliptical cavities aligned along a straight axis.

Preferably the filter comprises a top part and a bottom part arranged to be connected each other, in a known way, so as to shape the body of the filter.

Coupling irises are provided along the filter so that, from left to right, a first coupling iris is followed by a first cavity which is followed by a second coupling iris and by a second cavity and so on, until a last cavity (n) is followed by a last coupling iris (n+1).

According to the invention, tuning rods are located in each cavity along an arcuate axis B-B, and are held on a longitudinal plate arranged to support all the tuning rods.

It can be observed that the first and last (n) cavities require a larger degree of tuning in order to shift-down the filter pass-band, whereas the intermediate cavity or cavities require a smaller degree of tuning, as long as they are near the filter longitudinal center, in order to obtain the same pass-band action.

To this aim, the first and last cavity tuning rods are located at the transversal center of the respective cavities since there the internal electric field is at its maximum.

By transversally offsetting a tuning rod, its tuning action decreases since the internal electric field decreases.

This explains the arcuate position of the tuning rods.

Thanks to such a configuration it is possible to obtain a different tuning action in each cavity by moving all the rods according to an identical depth through respective passages located on each cavity along the arcuate axis B-B.

According to the invention the filter comprises an electro-mechanical tuning device comprising a single motor configured to rotate clockwise and counter-clockwise and to simultaneously move the whole set of tuning rods of the same depth by way of the longitudinal plate.

In summary, the single mode filter according to the invention is such to be configured to allocate any channel among a plurality of channels by simply changing the insertion depth of a set of tuning rods located along the arcuate axis B-B.

According to the invention, moreover, it is provided a method for designing and realizing the filter according to the invention comprising, for instance, one or more of the following steps:

a first step wherein, on the basis of possible reconfiguration features the filter is designed to operate in an upper channel foreseen in the field. The waveguide filter structure is consequently designed so that to operate without any tuning action (this is equivalent to have all the tuning rods outside the cavities), a second step, wherein it is experimentally determined the axis B-B so as to provide a filter configured to cover all the channels that need to be provided in the field, a third step wherein the body of the filter is modified by inserting passages along the axis B-B as designed, a fourth step wherein the longitudinal plate is realized so as to comprise the tuning rods located on the longitudinal plate according to the axis B-B, a fifth step wherein the tuning device is applied to the longitudinal plate and to the top or bottom parts of the filter body.

BRIEF DESCRIPTION OF DRAWINGS

These and further features and advantages of the present invention will appear more clearly from the following detailed description of preferred embodiments, provided by way of non-limiting examples with reference to the attached drawings, in which components designated by same or similar reference numerals indicate components having same or similar functionality and construction and wherein:

FIGS. 2a, 2b and 2c show section views of a device for controlling the insertion length of tuning rods in the filter of FIG. 1;

FIGS. 4a and 4b show another embodiment of present disclosure.

Figure 1:
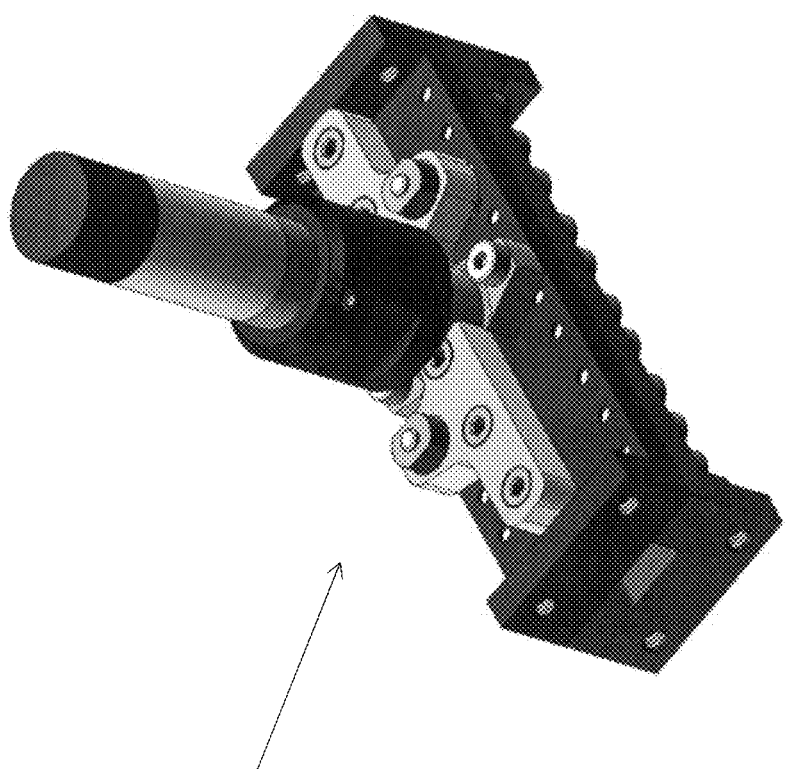
FIG. 1 shows a perspective view of a single mode cavity filter comprising motorised (or commanded) rods according to a first embodiment.

In the present description, terms like vertical and horizontal, upper and lower are used to indicate elements or parts having orientation and position as conventionally defined in common use, so that, in the present description such terms are to be interpreted in the way conventionally provided according to the common use.

DETAILED DESCRIPTION OF THE INVENTION

With reference to FIGS. 1, 2a, 2b, 2c and 3, a single mode cavity filter 10 is shown, comprising, for instance according to the example, six rectangular cavities 15 aligned along a straight axis A-A.

According to other embodiments the single mode filter comprises three or more rectangular or elliptical cavities without departing from the scope of the invention as claimed.

Preferably the filter 10 comprises a top part 16a and a bottom part 16b configured to be connected each other, in a known way, so as to shape the filter body (filter) 10.

Coupling irises 12 are provided along the filter 10, in a known way, so that, from left to right, a first coupling iris 12 is followed by a first cavity 15 which is followed by a second coupling iris 12 and by a second cavity 15 and so on, until a last cavity 15 (n) is followed by a last coupling iris 12 (n+1).

According to a preferred embodiment, tuning rods 11 are located in each cavity 15 along an arcuate axis B-B, for instance on the top part 16a of the filter 10 and are held by tuning rod holders 21 on a longitudinal plate 35 configured to support all the tuning rods 11.

Preferably all the tuning rods are made to comprise the same length and the first tuning rod 11 and the last tuning rod are aligned both to the straight axis A-A and to the arcuate axis B-B.

According to the preferred embodiment, the rods located among the first and the last tuning rods are located near the center of each cavity but misaligned from the A-A axis and aligned to the arcuate axis B-B by a certain displacement as regards the straight axis A-A.

Thanks to such a configuration it is possible to obtain a different tuning action in each cavity by moving all the rods 11 according to an identical depth through respective passages 18a located on each cavity 15 along the arcuate axis B-B.

In summary the single mode filter 10 according to the disclosed embodiment is such to be configured to allocate any channel among a plurality of channels by simply changing the insertion depth of a set of tuning rods 11 located along the arcuate axis B-B.

As a matter of fact, since the tuning amount required by the first and last filter cavities is maximum, while by moving toward the center of the filter the required tuning amount decreases, the tuning rod position is aligned to the axis A-A, in the first and last cavities, and is offset from the center, i.e. aligned to the B-B axis, for the other or central cavities.

For this reason, the other or central tuning rods are aligned along the arcuate axis B-B.

When a tuning rod is transversally offset from the central position of the cavity, its tuning action becomes lower since the electric field is lower in any position offset from the central position. Thanks to the above consideration, it is possible to experimentally determine the lower tuning action required by the central cavities and it becomes possible to obtain an identical depth of each rod with different tuning actions into each cavity.

As a matter of fact, by moving to an identical depth all the tuning rods 11 through the respective passages 18a along the arcuate axis B-B, it is possible to reconfigure the filter and provide a predetermined number of different channels, i.e. different central frequencies.

In summary, by moving to an identical depth all the tuning rods 11 it is possible to completely reconfigure the filter, since each intermediate or central tuning rod 11 is arranged to operate on a smaller amplitude of the electrical field.

According to the preferred embodiment the filter 10 comprises an electro-mechanical tuning device (tuning device) 30 comprising a single motor 31, for instance an electrically controlled rotating clockwise and counter-clockwise micro-motor, configured to simultaneously move the whole set of tuning rods 11 of the same depth by way of the longitudinal plate 35.

In particular, the longitudinal plate 35, that is comprised in the electro-mechanical device, is configured to connect all the rods 11 to the single motor 31, whereby the single motor 31 is configured to control the insertion depth of all the tuning rods 11.

Preferably the electro-mechanical device 30 is connected to suitable driving electronics 60 by way of electric wires 19a, 19b so that the insertion depth of the tuning rods is managed by the motor 31 under the control of the driving electronics 60.

In particular, according to the preferred embodiment, the device 30 comprises a worm-screw 32, connected to the micro-motor 31 and preferably coupled to a non-rotating nut 33.

More in particular the non-rotating nut 33 is adapted to slide forward or backward according to the clockwise or counter-clockwise rotation of the worm screw 32 connected to the micro-motor 31.

Preferably the non-rotating nut 33 is connected, in turn, to a bushing nut 34. For instance, a first end of the bushing nut 34 is fixed to the non-rotating nut 33 and a second end of the bushing nut, is preferably connected to the longitudinal plate 35 supporting the whole set of tuning rods 11.

According to such an example, the bushing nut 34 as well as the longitudinal plate 35 are configured to slide forward and backward together with the non-rotating nut 33 and aligned, for instance to the top part 16a, by way of alignment pins 26.

In summary, according to the preferred embodiment the non-rotating nut 33 and the bushing nut 34 allow that the whole set of rods slide forward or backward in the filter cavities 15 through the respective passages 18a, provided for instance on the top or bottom part, 16a or 16b, of the filter 10.

According to the preferred embodiment the rods 11 are made of ceramic and the passages 18a are adequately enlarged so as to avoid any contact between each passage 18a and the respective ceramic rod 11; such a feature is useful in order to avoid frictions between each tuning rod 11 and the respective passage 18a due to the forward or backward movements of the rods.

According to further embodiments, the rods 11 are made of metal or are metal plated. According to such further embodiments, wherein metallic or metal plated rods are provided, a ceramic ring is preferably provided, for instance on the passages 18a, in order to avoid any contact between each rod 11 and each respective passage 18a.

Figure 4A:
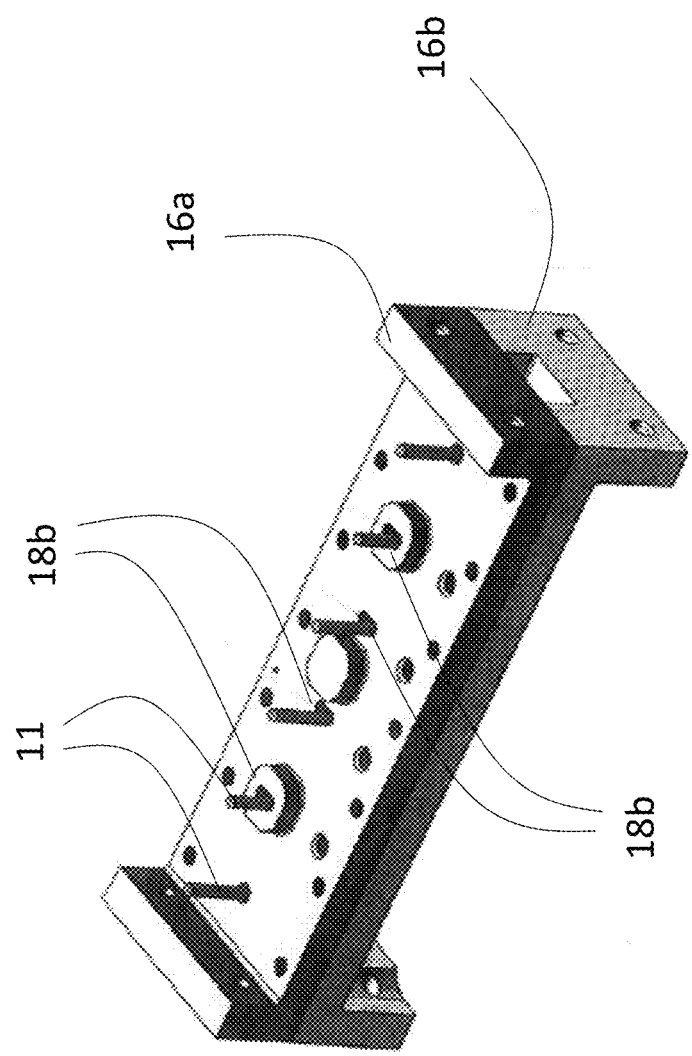

According to a further embodiment of the present disclosure it is provided that the top part 16a or the bottom part 16b of the filter 10 comprises a plurality of slots 18b (FIG. 4a, 4b) of a certain length L transversal (orthogonal) to the axis A-A and located among the first and the last rectangular cavity 15.

Preferably, according to this embodiment, the longitudinal plate respectively comprises slots located above and in correspondence of the slots 18b.

The slots 18b are configured to provide the possibility to locate the tuning rods 11 along any arcuate axis B-B on the longitudinal plate 35.

Such a configuration is particularly useful for experimentally realizing and verifying the characteristics of the filter 10 in terms of number of channels or center frequencies before any production.

Figure 2C:
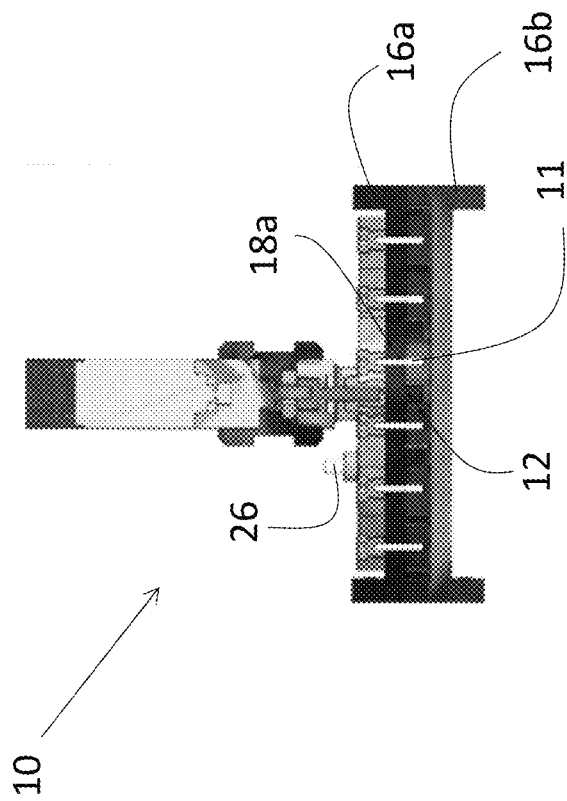
Figure 2B:
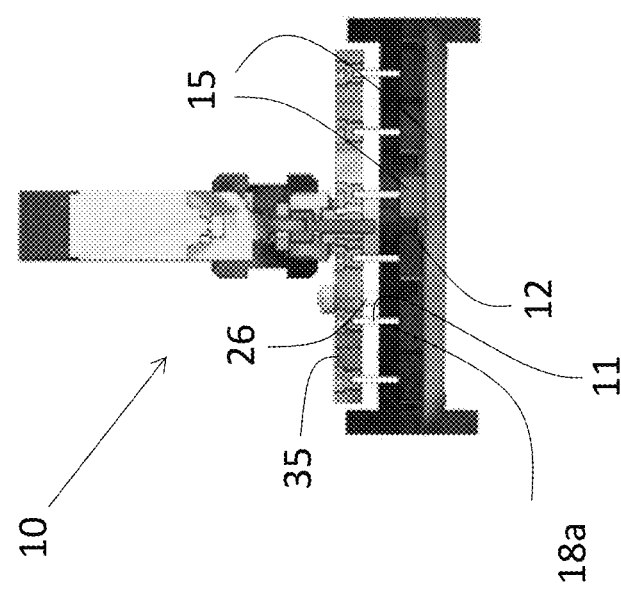
Figure 3:
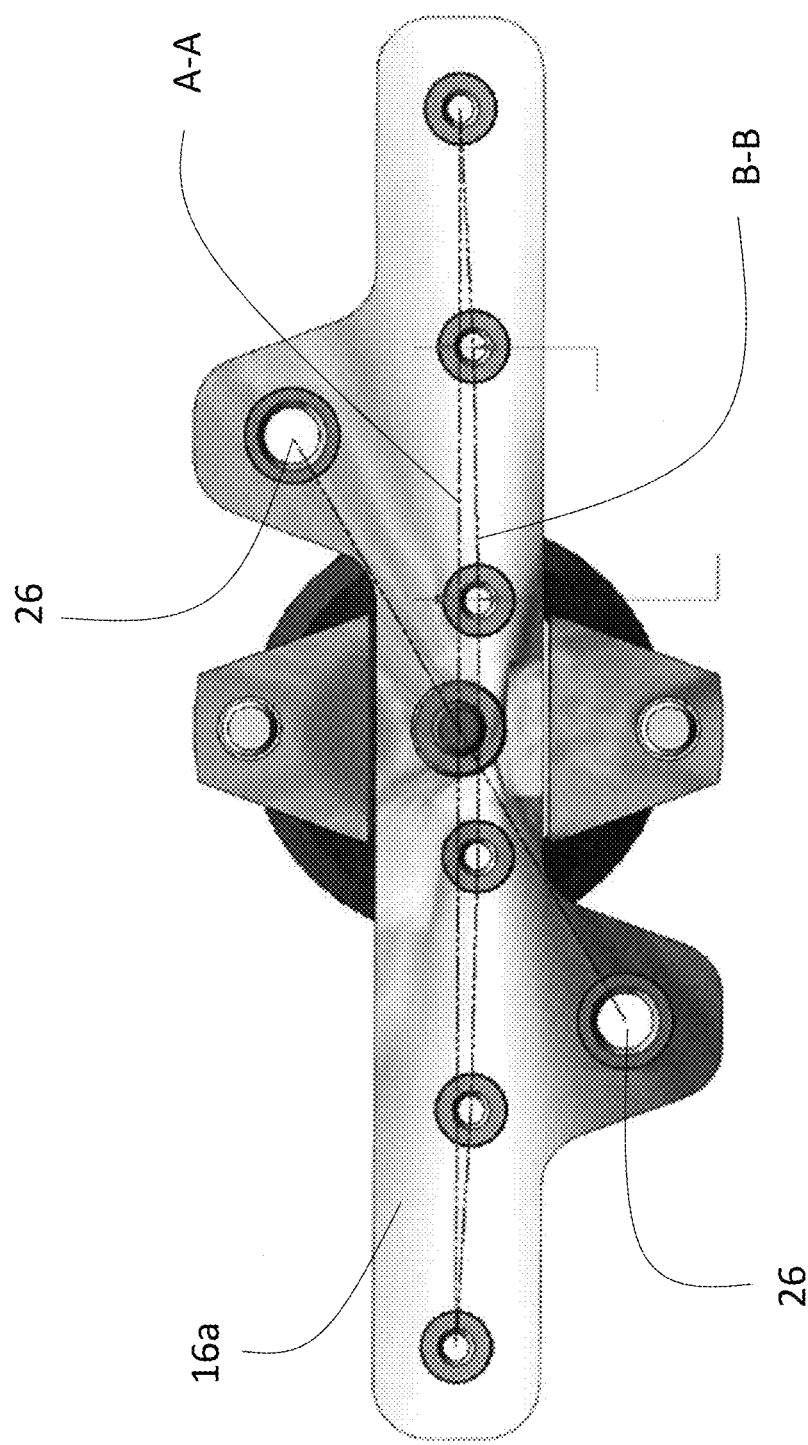
FIG. 3 shows an example of a top view of the filter of FIG. 1.

A process or method for designing and realizing the filter according to the invention preferably comprises the following steps:
  a first step wherein, on the basis of possible reconfiguration features the filter 10 is designed to operate in an upper channel foreseen in the field. The waveguide filter structure is consequently designed so that to operate without any tuning action (this is equivalent to have all the tuning rods in a position as shown in FIG. 2b, i.e. in a top position),
  a second step, wherein it is experimentally determined the axis B-B so as to provide a filter configured to cover all the channels that need to be provided in the field,
  a third step wherein the top or bottom part, 16a or 16b, of the filter 10 is modified by inserting passages 18a along the axis B-B as designed,
  a fourth step wherein the longitudinal plate 35 is realized so as to comprise the tuning rods 11 located on the longitudinal plate 35 according to the location of passages 18a along the axis B-B,
  a fifth step wherein the tuning device 30 is applied to the longitudinal plate 35 and to the top part 16a, as shown in FIGS. 2b and 2c, or to the bottom part 16b,
  a sixth step wherein the tuning device 30 is preferably connected to the driving electronics 60 in order to locally or remotely control, among a plurality of channels, the selection of one certain channel by way of the filter 10 as disclosed.

Known filters are comprised of a plurality of filters corresponding to the required number of channels to be provided in the field, whereby each channel may be allocated by means of an input and an output electro-mechanical device or electro-mechanical switch matrix.

Advantageously the proposed filter, according to present invention, is configured to substitute the plurality of filters by way of a single filter wherein each channel is electronically selectable by simply changing the depth of a set of tuning rods.

Of course, obvious changes and/or variations to the above disclosure are possible, as regards dimensions, shapes, materials, components, circuit elements, and connections, as well as details of the described construction and process without departing from the scope of the invention as defined by the claims that follow.

The invention claimed is:

1. A single mode cavity filter, comprising:
  a) at least three rectangular or elliptical resonant cavities and at least four coupling irises aligned along a straight axis, said filter being configured to be tuned by way of an electro-mechanical device in said filter, and
  b) respective tuning rods located in each of said at least three rectangular or elliptical resonant cavities and configured to change the tuning of said filter,
  wherein said tuning rods are aligned along an arcuate axis, and said electro-mechanical device is configured to move the tuning rods according to an identical depth by way of a single motor comprised in said electro-mechanical device.

2. The filter according to claim 1, wherein said electro-mechanical device comprises a longitudinal plate configured to mechanically connect all the tuning rods to said single motor.

3. The filter according to claim 2, wherein said electro-mechanical device further comprises a worm-screw connected to the single motor and coupled to a non-rotating nut connected to a bushing nut comprising one end connected to the longitudinal plate, whereby said electro-mechanical device is configured to move the tuning rods according to the identical depth.

4. The filter according to claim 2, wherein each cavity of said filter comprises respective slots in a top part or a bottom part of said filter, each of said respective slots being orthogonal to a longitudinal straight axis and comprising a respective certain length, whereby the tuning rods are configured to be located along said certain length in positions corresponding to said arcuate axis for tuning said filter.

5. The filter according to claim 2, wherein each cavity of said filter comprises a respective passage located along said arcuate axis, whereby said tuning rods are configured to be moved according to the identical depth through said respective passages for changing the tuning of said filter.

6. The filter according to claim 1, wherein each cavity of said filter comprises a respective passage located along said arcuate axis, whereby said tuning rods are configured to be moved according to the identical depth through said respective passages for changing the tuning of said filter.

7. The filter according to claim 6, wherein said filter comprises a top part and a bottom part, and said cavities and said respective passages are in said top or bottom part, respectively.

8. The filter according to claim 1, wherein each cavity of said filter comprises respective slots in a top part or a bottom part of said filter, each of said respective slots being orthogonal to a longitudinal straight axis and comprising a respective certain length, whereby the tuning rods are configured to be located along said certain length in positions corresponding to said arcuate axis for tuning said filter.

9. A method for providing a single mode cavity filter configured to be tuned by an electro-mechanical device in said filter, said method comprising:
   a) providing along a straight axis at least three rectangular or elliptical resonant cavities and at least four coupling irises,
   b) providing along an arcuate axis respective passages located on each respective cavity,
   c) providing tuning rods arranged to be moved according to an identical depth through said respective passages, and
   d) providing an electro-mechanical device configured to move all of the tuning rods by way of a single motor in said electro-mechanical device.

10. The method according to claim 9, wherein said step of providing respective passages located on each respective cavity comprises the step of providing respective slots in a top part or a bottom part of said filter, each of said respective slots being orthogonal to a longitudinal straight axis and comprising a respective certain length.

11. The method according to claim 10, wherein said step of providing an electro-mechanical device configured to move all the tuning rods comprises the step of providing a longitudinal plate mechanically connected to said single motor and comprising all the tuning rods connected to said longitudinal plate, whereby said electro-mechanical device is configured to move all the tuning rods according to the identical depth.

12. The method according to claim 9, wherein said step of providing an electro-mechanical device configured to move all the tuning rods comprises the step of providing a longitudinal plate mechanically connected to said single motor and comprising all the tuning rods connected to said longitudinal plate, whereby said electro-mechanical device is configured to move all the tuning rods according to the identical depth.

* * * * *